US009621022B1

(12) United States Patent
Avitan

(10) Patent No.: US 9,621,022 B1
(45) Date of Patent: Apr. 11, 2017

(54) METHOD AND APPARATUS FOR GENERATING COMPLEMENTARY SIGNALS

(71) Applicant: MARVELL ISRAEL (M.I.S.L) LTD., Yokneam (IL)

(72) Inventor: Shimon Avitan, Tal-El (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 373 days.

(21) Appl. No.: 14/285,089

(22) Filed: May 22, 2014

Related U.S. Application Data

(60) Provisional application No. 61/828,993, filed on May 30, 2013.

(51) Int. Cl.
  *H03M 1/08* (2006.01)
  *H02M 1/08* (2006.01)
(52) U.S. Cl.
  CPC ..................... *H02M 1/08* (2013.01)
(58) Field of Classification Search
  None
  See application file for complete search history.

(56) References Cited

U.S. PATENT DOCUMENTS

| 5,559,473 | A | 9/1996 | Anderson et al. |
| 5,946,203 | A * | 8/1999 | Jiang ................... H02M 1/4216 363/46 |
| 6,924,683 | B1 | 8/2005 | Hayter |
| 7,449,936 | B2 | 11/2008 | Shin et al. |
| 2010/0134161 | A1 | 6/2010 | Xu et al. |
| 2012/0286752 | A1 * | 11/2012 | Tsukiji .................. H02M 3/156 323/282 |

* cited by examiner

*Primary Examiner* — Timothy J Dole
*Assistant Examiner* — Monica Mata

(57) ABSTRACT

Aspects of the disclosure provide a circuit. The circuit includes a voltage step up circuit, a voltage control unit, and a complementary voltage generator. The voltage step up circuit is configured to receive a primary supply voltage of a first voltage level and output a secondary supply voltage of a second voltage level that is higher than the first voltage level. The voltage control unit is configured to receive the secondary supply voltage and to output a control voltage having a voltage level in a range from a ground level to the second voltage level. The complementary voltage generator is configured to operate based on the primary supply voltage and to generate a pair of complementary signals in response to the control voltage. The voltage sum of the pair of complementary signals is equivalent to the first voltage level.

20 Claims, 4 Drawing Sheets

METHOD AND APPARATUS FOR GENERATING COMPLEMENTARY SIGNALS

INCORPORATION BY REFERENCE

This present disclosure claims the benefit of U.S. Provisional Application No. 61/828,993, "METHOD AND APPARATUS OF GENERATING SC BASED COMPLEMENTARY CONTROL SIGNALS" filed on May 30, 2013, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Various functional circuits, such as a delay-locked loop (DLL), a phase-locked loop, a delay circuit, and the like operate based on a pair of complementary signals. A voltage sum of the pair of complementary signals is constant. Conventionally, the pair of complementary signals is generated using an operational amplifier.

SUMMARY

Aspects of the disclosure provide a circuit. The circuit includes a voltage step up circuit, a voltage control unit, and a complementary voltage generator. The voltage step up circuit is configured to receive a primary supply voltage of a first voltage level and to output a secondary supply voltage of a second voltage level that is higher than the first voltage level. The voltage control unit is configured to receive the secondary supply voltage and to output a control voltage having a voltage level in a range from a ground level to the second voltage level. The complementary voltage generator is configured to operate based on the primary supply voltage and generate a pair of complementary signals in response to the control voltage. The voltage sum of the pair of complementary signals is equivalent to the first voltage level.

According to an aspect of the disclosure, the circuit does not include an operational amplifier. In an example, the complementary voltage generator includes a transistor configured in a source follower topology to receive the primary supply voltage at a drain terminal, to receive the control voltage at a gate terminal and to output a first output voltage from a source terminal. For example, the transistor is biased in a triode region to output the first output voltage at the first voltage level.

Further, according to an aspect of the disclosure, the complementary voltage generator includes a first switched capacitor circuit having first switches coupled with a first capacitor. At least one of the first switches is controlled by the second voltage level. The first switched capacitor circuit is configured to charge a first plate of the first capacitor to the first output voltage and charge a second plate of the first capacitor to the first voltage level, and output a voltage drop across the first capacitor as the second output voltage. Further, the circuit includes a clock generator configured to generate non-overlapping clock signals in the primary supply voltage domain and the secondary supply voltage domain to control the switched capacitor circuit. In an example, the clock generator is configured to generate a first pair of non-overlapping clock signals using the first voltage level for a logic value, and generate a second pair of non-overlapping clock signals using the second voltage level for the logic value. At least a metal-oxide-semiconductor transistor is gate-controlled by the second voltage level. Further, the voltage control unit includes a second switched capacitor circuit configured to charge or discharge a second capacitor to generate the control voltage.

Aspects of the disclosure provide a method. The method includes stepping-up a first voltage level of a primary supply voltage to generate a secondary supply voltage of a second voltage level, generating, based on the secondary supply voltage, a control voltage having a voltage level in a range from a ground level to the second voltage level, and generating a pair of complementary signals in response to the control voltage. The voltage sum of the pair of complementary signals is equivalent to the first voltage level.

Aspects of the disclosure provide an apparatus that includes a circuit for generating a pair of complementary signals, and a delay circuit configured to receive the pair of complementary signals and operate with a delay as a function of the pair of complementary signals. The circuit includes a voltage step up circuit, a voltage control unit and a complementary voltage generator. The voltage step up circuit is configured to receive the primary supply voltage and to output a secondary supply voltage of a second voltage level that is higher than the first voltage level. The voltage control unit is configured to receive the secondary supply voltage and to output a control voltage having a voltage level in the range from a ground level to the second voltage level. The complementary voltage generator is configured to operate based on the primary supply voltage and generate the pair of complementary signals in response to the control voltage.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
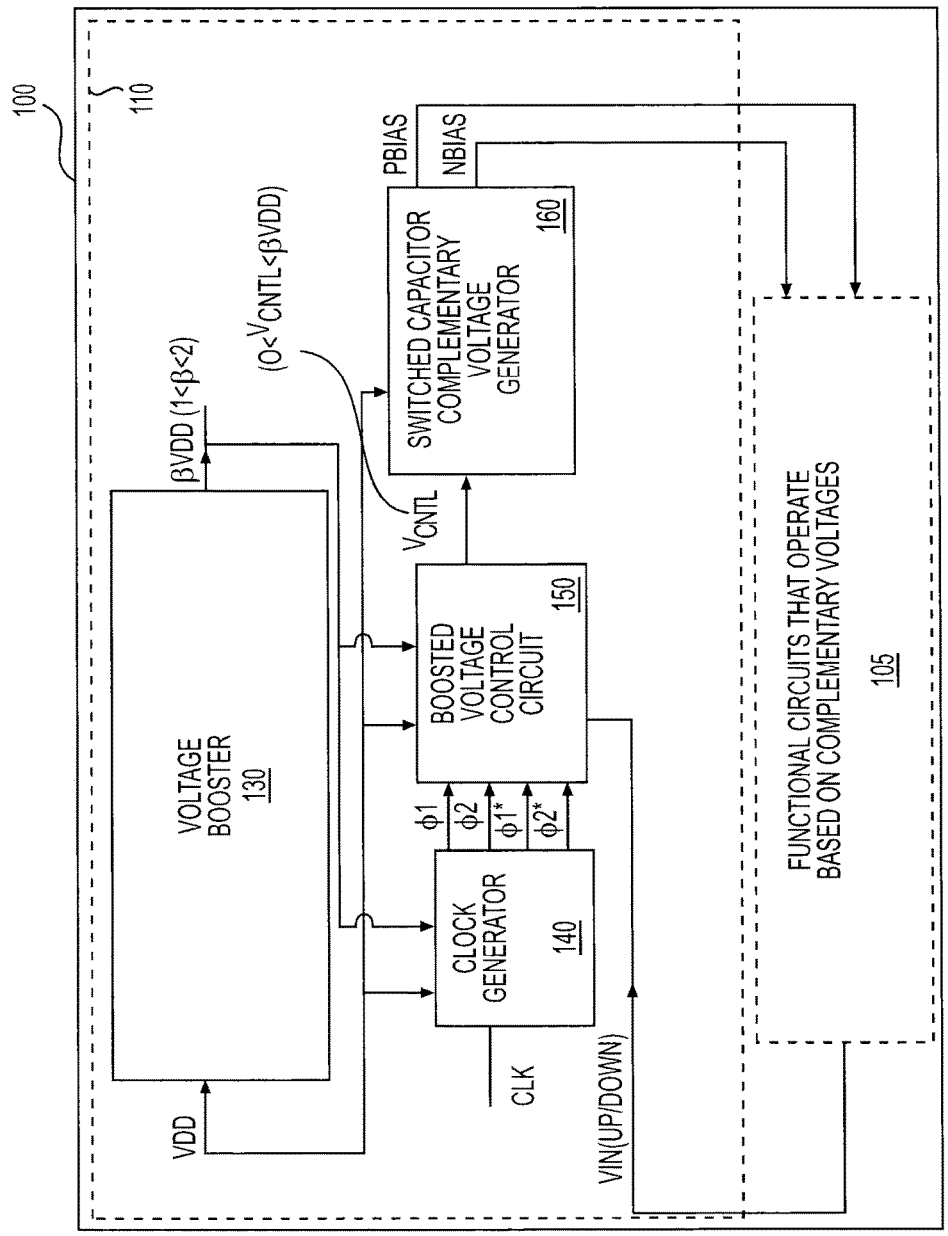
FIG. 1 shows a block diagram of a circuit example 100 according to an embodiment of the disclosure.

FIG. 1 shows a block diagram of a circuit example 100 according to an embodiment of the disclosure. The circuit 100 includes functional circuits 105 that operate based on a pair of complementary signals NBIAS and PBIAS. The voltage sum of the pair of complementary signals c is constant. In an example, the voltage sum is about a voltage level of a supply voltage, such as VDD in the FIG. 1 example. The circuit 100 includes a complementary voltage generator 110 configured to generate the pair of complementary signals NBIAS and PBIAS of an enlarged signal swing. In an embodiment, the complementary voltage generator 110 is configured to not rely on an operational amplifier to generate the pair of complementary signals.

According to an aspect of the disclosure, the circuit 100 is implemented on an integrated circuit (IC) chip. The IC chip receives the supply voltage VDD and a ground, and operates based on the supply voltage VDD and the ground. The supply voltage VDD is the primary supply voltage for the circuit 100.

In an embodiment, the functional circuits 105 and the complementary voltage generator 110 are coupled together in a loop, such as disclosed in Applicant's co-pending application Ser. No. 12/754,968, filed Apr. 6, 2010, and assigned to Marvell, which is incorporated herein by reference in its entirety. The functional circuits 105 have a performance parameter that depends on the pair of complementary signals NBIAS and PBIAS. The functional circuits 105 provide a feedback signal VIN as a function of the parameter to the complementary voltage generator 110. Then, the complementary voltage generator 110 generates the pair of complementary signals NBIAS and PBIAS based on the signal VIN.

In an example, the functional circuits 105 includes a delay chain that operates based on the supply voltage VDD. Further, the pair of complementary signals NBIAS and PBIAS is provided to the delay chain to adjust a delay of the delay chain. The functional circuits 105 include a detector circuit (not shown) configured to detect the delay and generate the feedback signal VIN based on the delay. In an example, the feedback signal VIN is a digital signal. For example, when the delay is longer than a threshold, the functional circuits 105 output logic "1" as the signal VIN (e.g., a relatively high voltage level), and when the delay is shorter than the threshold, the functional circuits 105 output logic "0" (e.g., a relatively low voltage level).

According to an aspect of the disclosure, the complementary voltage generator 110 steps up the voltage level of the primary supply voltage VDD to generate a secondary supply voltage that has a higher voltage level than the primary supply voltage VDD. The stepped up secondary supply voltage is used to control the generation of the complementary signals NBIAS and PBIAS in order to increase the signal swing to the level very close to the supply voltage VDD in an example.

In an embodiment, the complementary voltage generator 110 uses a switched-capacitor technique to generate the pair of complementary signals NBIAS and PBIAS, obviating the need for an operational amplifier. Specifically, in the FIG. 1 example, the complementary voltage generator 110 includes a voltage booster 130, a clock generator 140, a boosted voltage control circuit 150, and a switched capacitor complementary voltage generator 160. These elements are coupled as shown in FIG. 1.

The voltage booster 130 is configured to generate a secondary supply voltage with a boosted voltage level that is higher than the main supply voltage VDD. In the FIG. 1 example, the boosted voltage level of the secondary supply voltage is $\beta VDD$ ($1<\beta<2$). The voltage booster 130 can use any suitable technique to generate the secondary supply voltage. According to an aspect of the disclosure, the secondary supply voltage is used to voltage-bias gate terminals and/or substrate terminals of metal-oxide-semiconductor (MOS) transistors, and does not require large current driving capability. The voltage booster 130 can use simple circuitry to generate the secondary supply voltage, and can be implemented in a relatively small footprint.

The clock generator 140 is configured to generate non-overlapping clocks $\phi 1$ and $\phi 2$ in the primary supply voltage VDD domain, and to generate corresponding non-overlapping boosted clocks $\phi 1^*$ and $\phi 2^*$ in the secondary supply voltage domain. In an example, the two stable voltage levels for the clocks $\phi 1$ and $\phi 2$ are ground and VDD; and the two stable voltage levels for the boosted clocks $\phi 1^*$ and $\phi 2^*$ are ground and $\beta VDD$. Further, each voltage transition in the boosted clock $\phi 1^*$ has the same timing as a voltage transition in the clock $\phi 1$, and each voltage transition in the boosted clock $\phi 2^*$ has the same timing as a voltage transition in the clock $\phi 2$.

In an embodiment, the clock generator 140 receives an input clock CLK, and generates the clocks $\phi 1$ and $\phi 2$, and the boosted clocks $\phi 1^*$ and $\phi 2^*$ based on the input clock CLK. However, the rate of the clocks $\phi 1$ and $\phi 2$, and the boosted clocks $\phi 1^*$ and $\phi 2^*$ is not necessarily the rate of the input clock CLK.

The boosted voltage control circuit 150 is configured to generate a boosted analog control signal $V_{CNTL}$ in response to the digital feedback signal VIN. In an embodiment, the voltage level of the boosted analog control signal $V_{CNTL}$ dynamically changes in a range from 0V to $\beta VDD$ according to the digital feedback signal VIN. For example, when the digital feedback signal VIN is logic "1", the boosted analog control signal $V_{CNTL}$ rises, and when the digital feedback signal VIN is logic "0", the boosted analog control signal $V_{CNTL}$ falls.

Figure 3:
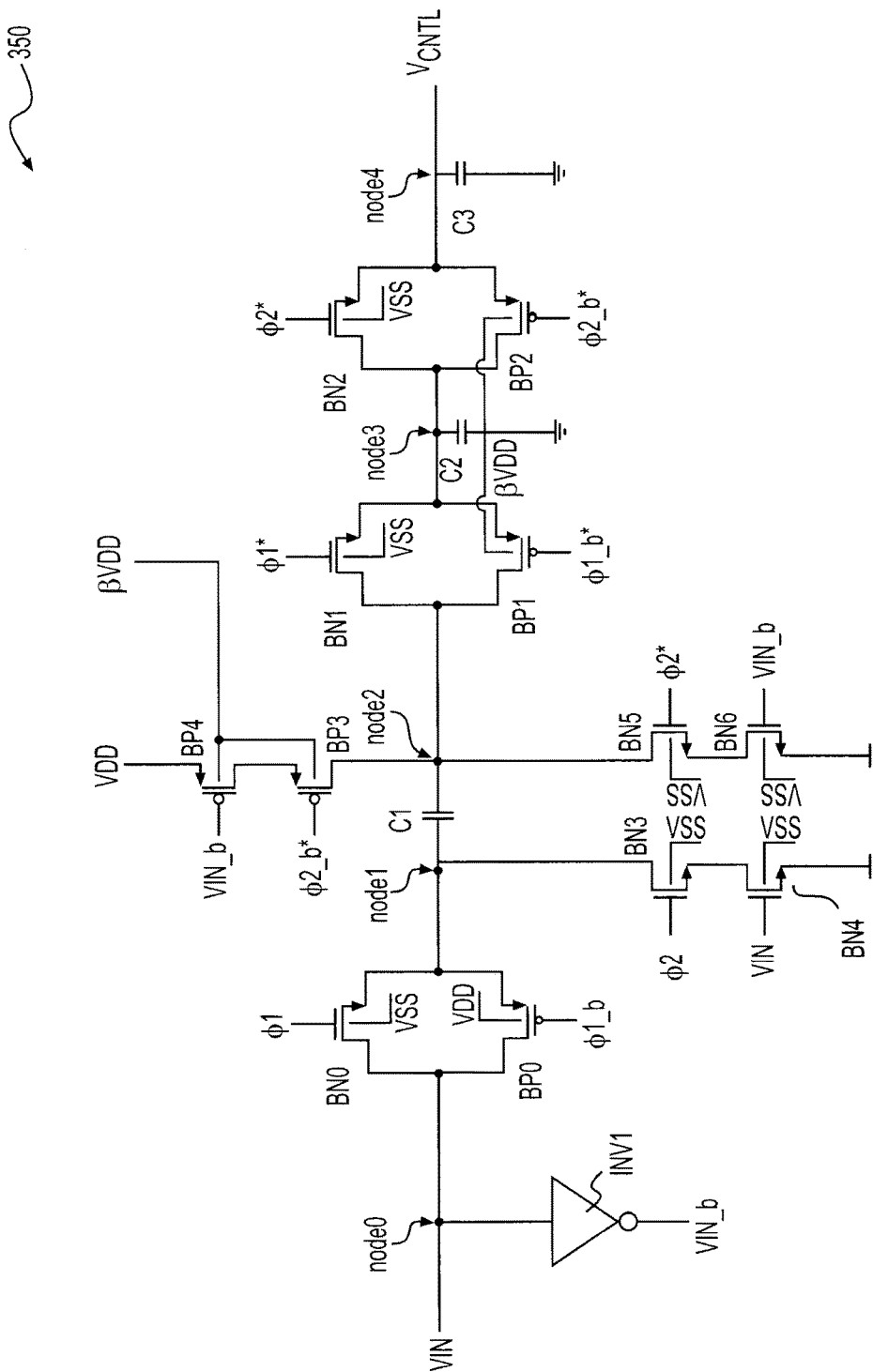
FIG. 3 shows a schematic diagram of a boosted voltage control circuit 350 according to an embodiment of the disclosure.

In an embodiment, the boosted voltage control circuit 150 is implemented using switched capacitor technique. A detail example of the boosted voltage control circuit 150 is shown in FIG. 3, and will be described in detail with reference to FIG. 3.

The switched capacitor complementary voltage generator 160 is configured to generate the pair of complementary signals NBIAS and PBIAS in response to the boosted analog control signal $V_{CNTL}$. The voltage sum of the pair of complementary signals NBIAS and PBIAS is constant and substantially equals the primary supply voltage VDD. According to an aspect of the disclosure, the boosted voltage level of the boosted analog control signal $V_{CNTL}$ enables the pair of complementary signals to have a larger signal swing, such as a full range of [0,VDD].

Figure 4:
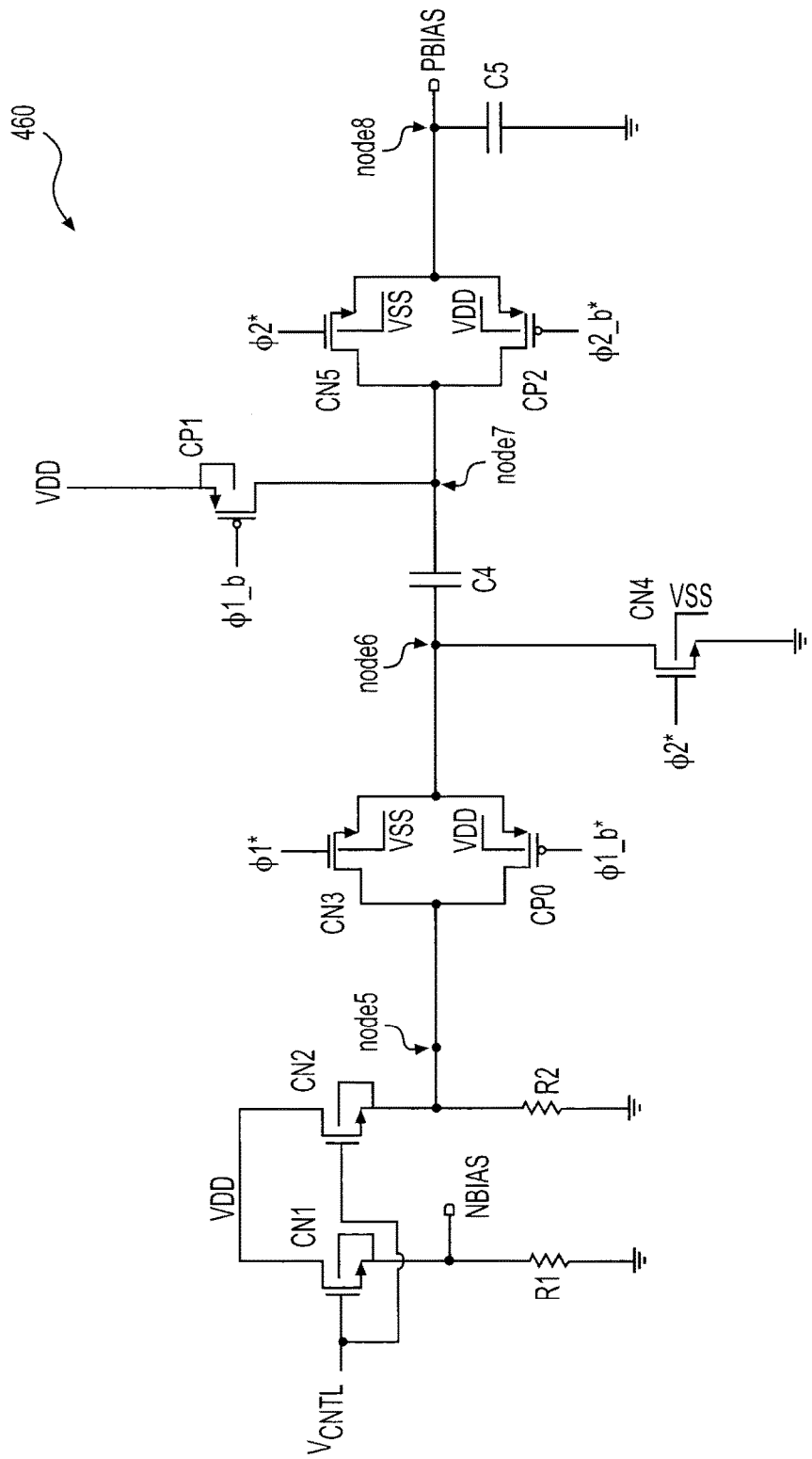
FIG. 4 shows a schematic diagram of a complementary voltage generator 460 according to an embodiment of the disclosure.

In an embodiment, the switched capacitor complementary voltage generator 160 is implemented using switched capacitor technique. A detail example of the switched capacitor complementary voltage generator 160 is shown in FIG. 4, and will be described in detail with reference to FIG. 4.

During operation, in an example, the voltage booster 130 receives the primary supply voltage VDD and generates the secondary supply voltage $\beta VDD$. The clock generator 140 receives the clock signal CLK, the primary supply voltage VDD and the secondary supply voltage $\beta VDD$, and generates the clocks $\phi 1$ and $\phi 2$ in the primary supply voltage domain, and the boosted clocks $\phi 1^*$ and $\phi 2^*$ in the secondary supply voltage domain. The functional circuits 105 receive the pair of complementary signals NBIAS and PBIAS, and operate based on the pair of complementary signals NBIAS and PBIAS. At least one parameter of the functional circuits 105 depends on the voltages of the complementary signals NBIAS and PBIAS. The functional circuits 105 provide the feedback signal VIN as a function of the parameter. In an example, the feedback signal VIN is a digital signal and is indicative of an adjustment direction of the voltages for complementary signals NBIAS and PBIAS to achieve a desired value in the parameter.

The boosted voltage control circuit 150 receives the feedback signal VIN and generates the boosted analog control signal $V_{CNTL}$ in the range from ground to $\beta VDD$ in response to the feedback signal VIN. Then, the switched capacitor complementary voltage generator 160 adjusts voltage levels of the complementary signals NBIAS and PBIAS based on the boosted analog control signal $V_{CNTL}$.

According to an aspect of the disclosure, the boosted secondary supply voltage enables the complementary voltage generator 110 to use simple circuits, such as the switched capacitor circuits, to generate the pair of complementary signals of an increased signal swing, such as a full range of [0,VDD]. The complementary voltage generator 110 does not require an operational amplifier, and can achieve various benefits, such as insensitivity to process variation and mismatch, low power consumption, small silicon area, increased bandwidth, ease of process migration, and the like.

For example, generally, an operational amplifier is sensitive to process variation and mismatch, and thus the accuracy of an operational amplifier based complementary voltage generator is affected by the process variation and mismatch. To improve the accuracy of the operational amplifier based complementary voltage generator, in an example, transistor sizes in the circuits are scaled up, and thus the operational amplifier based complementary voltage generator requires a relatively large silicon area. Without an operational amplifier, the complementary voltage generator 110 uses switched capacitor circuits that have stable performance in response to the process variation and mismatch, and the switched capacitor circuits generally require relatively small silicon area.

Further, an operational amplifier consumes larger amount of power than switched capacitor circuit. In addition, the operational amplifier is used in a close loop topology to generate complementary voltages, however the close loop topology tends to limit circuit bandwidth. Without using an operational amplifier, the complementary voltage generator 110 has a reduced power consumption and relaxed bandwidth requirement.

In another example, an operational amplifier based complementary voltage generator requires significant tuning effort when migrating to a different manufacturing process. The switched capacitor based complementary voltage generator requires much less tuning effort to migrate to another manufacturing process.

Figure 2:
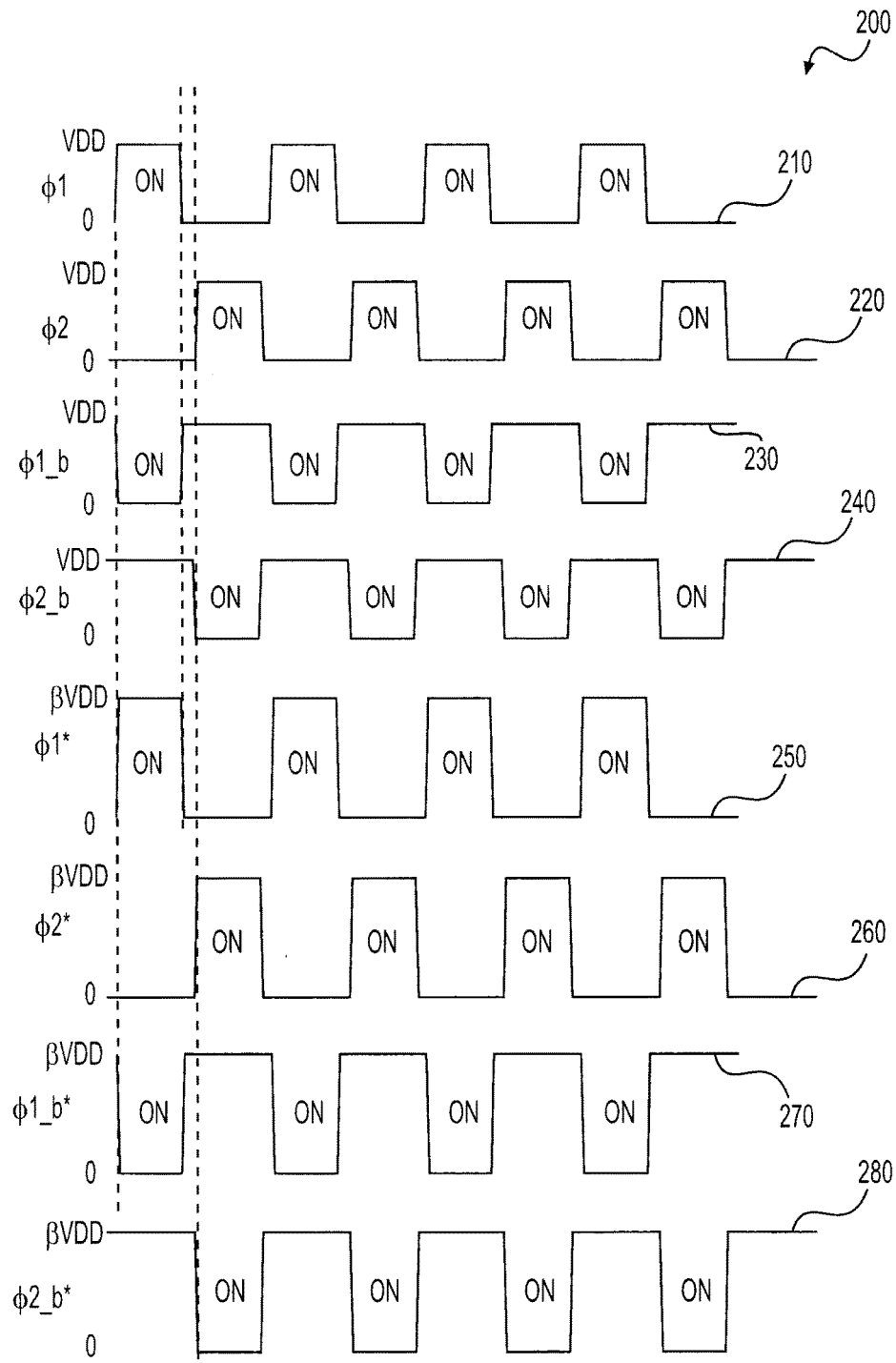
FIG. 2 shows a plot 200 of waveforms according to an embodiment of the disclosure.

FIG. 2 shows a plot 200 of clock signal waveforms according to an embodiment of the disclosure. The plot 200 includes a first waveform 210 for a clock φ1, a second waveform 220 for a clock φ2, a third waveform 230 for a clock φ1_b which is an inversed clock of the clock φ1, a fourth waveform 240 for a clock φ2_b which is an inversed clock of the clock φ2, a fifth waveform 250 for a boosted clock φ1*, a sixth waveform 260 for a boosted clock φ2*, a seventh waveform 270 for a boosted clock φ1_b* which is an inversed clock of the boosted clock φ1*, and an eighth waveform 280 for a boosted clock φ2_b* which is an inversed clock of the boosted clock φ2*.

In the FIG. 1 example, the clocks φ1 and φ2 are non-overlapping clocks. The clocks φ1, φ2, φ1_b, and φ2_b are in the VDD domain where the voltage level for logic "1" is about VDD and the voltage level for logic "0" is about ground. The boosted clocks φ1*, φ2*, φ1_b*, and φ2_b* respectively have the same transition timings as the clocks φ1, φ2, φ1_b, and φ2_b. Further, the boosted clocks φ1*, φ2*, φ1_b*, and φ2_b* are in the βVDD domain where the voltage level for logic "1" is about βVDD and the voltage level for logic "0" is about ground.

In an embodiment, the clocks φ1, φ2, φ1_b, and φ2_b and the boosted clocks φ1*, φ2*, φ1_b*, and φ2_b* are generated by the clock generator 140 and are used to control the boosted voltage control unit 150 and the switched capacitor complementary voltage generator 160.

FIG. 3 shows a schematic diagram of a boosted voltage control circuit 350 according to an embodiment of the disclosure. The boosted voltage control circuit 350 receives a primary supply voltage VDD, a secondary supply voltage βVDD (1<β<2) having a constant voltage level higher than the primary supply voltage VDD, and the ground, as shown by VSS. Further, the boosted voltage control circuit 350 receives non-overlapping clock signals, such as the clocks φ1, φ2, φ1_b, and φ2_b and the boosted clocks φ1*, φ2*, φ1_b*, and φ2_b* shown in FIG. 2. The boosted voltage control circuit 350 receives a digital input signal VIN, and outputs a boosted analog control signal $V_{CNTL}$ in response to the digital input signal VIN. The boosted voltage control circuit 350 can be used in the FIG. 1 as the boosted voltage control circuit 150.

Specifically, in the FIG. 3 example, the boosted voltage control circuit 350 includes N-type MOS transistors BN0 to BN6, P-type MOS transistors BP0-BP4, capacitors C1-C3, and an inverter INV1. These elements are coupled together as shown in FIG. 3.

The boosted voltage control circuit 350 receives the digital input signal VIN at node 0, and generates an inversed input signal VIN_b by the inverter INV1. The transistors BN0 and BP0 are coupled together to form a first CMOS transmission gate between node 0 and node 1. The first CMOS transmission gate is controlled by the clock φ1 and the clock φ1_b. The capacitor C1 is coupled between node 1 and node 2. The transistors BN1 and BP1 are coupled together to form a second CMOS transmission gate between node 2 and node 3. The second CMOS transmission gate is controlled by the boosted clocks φ1* and φ1_b*. The capacitor C2 is coupled between node 3 to ground. The transistors BN2 and BP2 are coupled together to form a third CMOS transmission gate between node 3 and node 4. The third CMOS transmission gate is controlled by the boosted clocks φ2* and φ2_b*. The capacitor C3 is coupled between node 4 and ground. The boosted voltage control circuit 350 outputs the boosted analog control signal $V_{CNTL}$ from node 4.

Further, the transistors BN3 and BN4 are coupled in series to form a first pull down circuit to pull down a voltage level at node 1 under the control of the clock φ2 and the input signal VIN. The transistors BN5 and BN6 are coupled in series to form a second pull down circuit to pull down a voltage level at node 2 under the control of the boosted clock φ2* and the inversed input signal VIN_b. The transistors BP3 and BP4 are coupled in series to form a pull up circuit to pull up a voltage level at node 2 under the control of the inversed input VIN_b and the inversed boosted clock φ2_b*.

In the FIG. 3 example, the transistors BN0, BP0, BN3 and BN4 operate in the VDD domain. In the VDD domain, the high voltage level (e.g., logic "1") for the control voltage to the gate terminals of the transistors is about VDD and the bias voltage to the substrate terminals of the P-type MOS transistors is about VDD. Further, the transistors BP3, BP4, BN5, BN6, BN1, BP1, BN2 and BP2 operate in the boosted voltage βVDD domain. In the boosted voltage βVDD domain, the high voltage level (e.g., logic "1") for the control voltage to the gate terminals of the transistors is about βVDD and the bias voltage to the substrate terminals of the P-type MOS transistors is about βVDD.

During operation, in an embodiment, when the input signal VIN is logic "1" (e.g., a relatively high voltage, such as about VDD), the boosted analog control signal $V_{CNTL}$ increases the voltage level in the range [0, βVDD]; and when the input signal VIN is logic "0" (e.g., a relatively low voltage, such as about ground), the boosted analog control signal $V_{CNTL}$ decreases the voltage level in the range [0, βVDD].

Specifically, in the case the input signal VIN is logic "1", when the clock φ1 is logic "0" (e.g., about ground), the boosted clock φ1* is also logic "0", the clock φ2 is logic "1" (e.g., about VDD), and the clock φ2* is logic "1" (e.g., about βVDD). Then the first CMOS transmission gate and the second CMOS transmission gate are switched off, and the first pull-down circuit is switched on to discharge the left plate of the capacitor C1 and pull down the voltage level at node 1 to ground. Further, the second pull-down circuit is switched off and the pull-up circuit is switched on to charge the right plate of the capacitor C1, and pull up the voltage level at node 2 to VDD. Thus, the voltage across the capacitor C1 is about VDD.

When the clock φ1 transits to logic "1", the boosted clock φ1* also transits to logic "1", the clock φ2 transits to logic "0", and the boosted clock φ2* transits to logic "0". Then, the first pull-down circuit is switched off and the first CMOS transmission gate is switched on to charge the left plate of the capacitor to about the voltage level of the input signal VIN, such as about VDD. The second pull-down circuit and the pull-up circuit are switched off, and the voltage on the right plate of the capacitor C1 jumps to about 2VDD. Because the second CMOS transmission gate is switched on, the capacitor C2 is charged up. In an embodiment, the capacitor C1 is much larger than the capacitor C2, then the voltage on the node 3 is about 2VDD.

When the clock φ1 transits back to logic "0", the boosted clock φ1* also transits to logic "0", the clock φ2 transits to logic "1", and the clock φ2* transits to logic "1". The second CMOS transmission gate is switch off and the third CMOS transmission gate is switched on, an amount of charge stored in the capacitor C2 is transferred to the capacitor C3, and the boosted analog control signal $V_{CNTL}$ on node 4 increases. In an example, the amount is proportional to the factor C3/(C2+C3). Thus, in an example giving enough time (enough clock cycles), and under the assumption of no loss on the transmission gates, the boosted analog control signal $V_{CNTL}$ gradually increases and approaches 2VDD.

In the case the input signal VIN is logic "0", the first pull down circuit is switched off and the pull-up circuit is switched off, and node 1 and node 2 are discharged to ground. Specifically, when the clock φ1 is logic "1", the boosted clock φ1* is also logic "1", the clock φ2 is logic "0", the clock φ2* is logic "0", the first CMOS transmission gate is switched on to discharge the node 1 to ground. When the clock φ1 is logic "0", the boosted clock φ1* is also logic "0", the clock φ2 is logic "1", the clock φ2* is logic "1", the second pull-down circuit is switched on to discharge and pull-down node 2 to ground.

When the clock φ1 transits to logic "1", the boosted clock φ1* also transits to logic "1", the clock φ2 transits to logic "0", and the clock φ2* transits to logic "0". Then, the second CMOS transmission gate is switched on to discharge the capacitor C2.

When the clock φ1 transits back to logic "0", the boosted clock φ1* also transits to logic "0", the clock φ2 transits to logic "1", and the clock φ2* transits to logic "1". The second CMOS transmission gate is switch off and the third CMOS transmission gate is switched on, an amount of charge stored in the capacitor C3 is transferred to the capacitor C2, and the boosted analog control signal $V_{CNTL}$ on node 4 decreases. In an example, the amount of charge been transferred is proportional to the factor C2/(C2+C3). Thus, in an example giving enough time (enough clock cycles), and under the assumption of no loss on the CMOS transmission gates, the boosted analog control signal $V_{CNTL}$ gradually drops to ground.

FIG. 4 shows a schematic diagram of a switched capacitor complementary voltage generator 460 according to an embodiment of the disclosure. The complementary voltage generator 460 receives a primary supply voltage VDD and ground, as shown by VSS. Further, the switched capacitor complementary voltage generator 460 receives non-overlapping clock signals, such as the clocks φ1, φ2, φ1_b, and φ2_b and the boosted clocks φ1*, φ2*, φ1_b*, and φ2_b* shown in FIG. 2. Then, the switched capacitor complementary voltage generator 460 receives a boosted analog control signal $V_{CNTL}$, and outputs a pair of complementary signals NBIAS and PBIAS in response to the boosted analog control signal $V_{CNTL}$. The boosted analog control signal $V_{CNTL}$ has a voltage level in the range of [0, βVDD]. The voltage sum of the complementary signals NBIAS and PBIAS is constant, for example, about the level of VDD. The switched capacitor complementary voltage generator 460 can be used in the FIG. 1 as the switched capacitor complementary voltage generator 160.

Specifically, in the FIG. 4 example, the switched capacitor complementary voltage generator 460 includes N-type MOS transistors CN1 to CN5, P-type MOS transistors CP0-CP2, capacitors C4 and C5, and resistors R1 and R2. These elements are coupled together as shown in FIG. 4.

The transistor CN1 is configured as a source follower to receive the boosted analog control signal $V_{CNTL}$ at the gate terminal and output the signal NBIAS from the source terminal. Generally, due to body effect, the voltage gain of source follower is less than one. Thus, when the voltage on the gate terminal is not boosted, in other words, is equal to or less then the supply voltage VDD, the transistor CN1 operates in a saturation region. In the saturation region, the voltage on the source terminal is less than 1/(1+η)VDD due to body effect. In an example, η is about 0.2. Thus, the dynamic range for the voltage on the source terminal of the transistor CN1 is not able to achieve the full dynamic range of [0, VDD].

According to an aspect of the disclosure, when the boosted analog control signal $V_{CNTL}$ is larger than VDD, the transistor CN1 operates in a triode region. In the triode region, the internal resistance of the transistor CN1 decreases with the increase of the boosted analog control signal $V_{CNTL}$, and the voltage output from the source terminal continues to increase. In an example, when the resistance of the resistor R1 is much larger than the internal resistance of the transistor CN1, the voltage on the source terminal of the transistor CN1 approaches VDD. Thus, in an example, the dynamic range of the signal NBIAS is about the full range of [0, VDD].

Further, in the FIG. 4 example, the transistor CN2 is coupled with the transistor CN1 in a current mirror manner. In an example, assuming low mismatch between transistors CN1 and CN2, the voltage at node 5 is about the same voltage level as the signal NBIAS.

The transistors CN3 and CP0 are coupled together to form a fourth CMOS transmission gate between node 5 and node 6. The fourth CMOS transmission gate is controlled by the boosted clocks φ1* and φ1_b*. The capacitor C4 is coupled between node 6 and node 7. The transistors CN5 and CP2 are coupled together to form a fifth CMOS transmission gate between node 7 and node 8. The capacitor C5 is coupled between node 8 and ground. The switched capacitor complementary voltage generator 460 outputs the signal PBIAS from node 8.

Further, the transistor CN4 is configured to pull down a voltage level at node 6 under the control of the boosted clock $\phi 2^*$ and the transistor CP1 is configured to pull up a voltage level at node 7 under the control of the clock $\phi 1\_b$.

During operation, in an example, assuming at a time when the boosted clock $\phi 2^*$ is logic "1", the voltage on node 6 is pulled down to ground. When the boosted clock $\phi 2^*$ transits to logic "0" and the boosted clock $\phi 1^*$ is logic "1", the fourth CMOS transmission gate is switched on and the fifth CMOS transmission gate is switched off. The left plate of the capacitor C4 (node 6) is charged up from node 5 to the voltage level of the signal NBIAS, the right plate of the capacitor C4 (node 7) is pulled up to VDD by the pull up transistor CP1. Then, the voltage across the capacitor C4 is the difference between VDD and the voltage level of the signal NBIAS (VDD-NBIAS).

When the boosted clock $\phi 1^*$ transits to logic "0" and the boosted clock $\phi 2^*$ transits logic "1", the fourth CMOS transmission gate is switched off and the fifth CMOS transmission gate is switched on. The left plate of the capacitor C4 is pulled down to ground by the transistor CN4, then the right plate of the capacitor C4 follows the voltage change and drops to VDD-NBIAS. In addition, because the fifth CMOS transmission gate is switched on, the signal PBIAS on node 8 has the same voltage level (VDD-NBIAS) as node 7. Thus, the signals NBIAS and PBIAS are complementary signals.

According to an aspect of the disclosure, the boosted voltage control circuit 350, and the complementary voltage generator 460 are equivalent to two low pass filters. For example, the second CMOS transmission gate, the third CMOS transmission gate and the capacitors C2 and C3 are coupled together to form a first low pass filter to generate the boosted analog control signal $V_{CNTL}$. The fourth CMOS transmission gate, the fifth CMOS transmission gate, and the capacitors C4 and C5 are couple together to form a second low pass filter. In an embodiment, in order to maintain system stability, the first low pass filter is configured to be dominant in the system. For example, the capacitor C2 is selected to be much smaller than the capacitor C3.

Further, in order for the signal PBIAS to fast track a change of the signal NBIAS, the capacitor C4 and the capacitor C5 are selected of the same order.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
    a voltage step up circuit configured to receive a primary supply voltage of a first voltage level and to output a secondary supply voltage of a second voltage level that is higher than the first voltage level;
    a voltage control unit configured to receive the secondary supply voltage and to output a control voltage having a voltage level in a range from a ground level to the second voltage level; and
    a complementary voltage generator configured to operate based on the primary supply voltage and to generate a pair of complementary signals in response to the control voltage, the control voltage having the voltage level in the range from the ground level to the second voltage level, and a voltage sum of the pair of complementary signals being equivalent to the first voltage level.

2. The circuit of claim 1, wherein the circuit does not include an operational amplifier.

3. The circuit of claim 1, wherein the complementary voltage generator comprises:
    a transistor configured in a source follower topology to receive the primary supply voltage at a drain terminal, to receive the control voltage at a gate terminal and to output a first output voltage from a source terminal.

4. The circuit of claim 3, wherein the transistor is biased in a triode region to output the first output voltage at the first voltage level.

5. The circuit of claim 1, wherein the complementary voltage generator comprises:
    a first switched capacitor circuit having first switches coupled with a first capacitor, at least one of the first switches being controlled by the second voltage level, the first switched capacitor circuit being configured to charge a first plate of the first capacitor to a first output voltage and charge a second plate of the first capacitor to the first voltage level, and output a voltage drop across the first capacitor as a second output voltage.

6. The circuit of claim 5, further comprising:
    a clock generator configured to generate non-overlapping clock signals in the primary supply voltage domain and the secondary supply voltage domain to control the first switches.

7. The circuit of claim 6, wherein the voltage control unit comprises:
    a second switched capacitor circuit configured to charge or discharge a second capacitor to generate the control voltage.

8. The circuit of claim 5, wherein at least a metal-oxide-semiconductor transistor is gate-controlled by the second voltage level.

9. The circuit of claim 1, wherein the voltage control unit is configured to increase or decrease the voltage level of the control signal in response to a digital signal that is generated as a function of voltage levels of the pair of complementary signals.

10. A method, comprising:
    stepping-up a first voltage level of a primary supply voltage, to generate a secondary supply voltage of a second voltage level that is higher than the first voltage level;
    generating, based on the secondary supply voltage, a control voltage having a voltage level in a range from a ground level to the second voltage level; and
    generating a pair of complementary signals in response to the control voltage, the control voltage having the voltage level in the range from the ground level to the second voltage level, a voltage sum of the pair of complementary signals being equivalent to the first voltage level.

11. The method of claim 10, wherein generating the pair of complementary signals in response to the control voltage further comprises:
    generating, without using an operational amplifier, the pair of complementary signals in response to the control voltage.

12. The method of claim 10, wherein generating the pair of complementary signals in response to the control voltage further comprises:

biasing a gate terminal of a transistor using the control voltage;
biasing a drain terminal of the transistor using the supply voltage; and
outputting a first output voltage from a source terminal of the transistor.

13. The method of claim 12, further comprising:
biasing the transistor in a triode region to output the first output voltage at about the first voltage level.

14. The method of claim 10, further comprising:
charging a first plate of a first capacitor to a first output voltage;
charging a second plate of the first capacitor to the first voltage level; and
outputting a voltage drop across the first capacitor as a second output voltage.

15. The method of claim 14, further comprising:
generating non-overlapping clock signals having the second voltage level to control switches for charging the first capacitor.

16. The method of claim 10, wherein generating, based on the secondary supply voltage, the control voltage having the voltage level in the range from the ground level to the second voltage level further comprises:
increasing/decreasing the control voltage in the range from the ground level to the second voltage level in response to a digital signal that is generated as a function of voltage levels of the pair of complementary signals.

17. An apparatus, comprising:
a circuit configured to operate based on a primary supply voltage of a first voltage level, and generate a pair of complementary signals, a voltage sum of the pair of complementary signals being equivalent to the first voltage level, the circuit comprising:
  a voltage step up circuit configured to receive the primary supply voltage and to output a secondary supply voltage of a second voltage level that is higher than the first voltage level;
  a voltage control unit configured to receive the secondary supply voltage and to output a control voltage having a voltage level in the range from a ground level to the second voltage level; and
  a complementary voltage generator configured to operate based on the primary supply voltage and to generate the pair of complementary signals in response to the control voltage, the control voltage having the voltage level in the range from the ground level to the second voltage level; and
a delay circuit configured to receive the pair of complementary signals and operate with a delay as a function of the pair of complementary signals.

18. The apparatus of claim 17, wherein the circuit does not include an operational amplifier.

19. The apparatus of claim 17, wherein the complementary voltage generator comprises:
a transistor configured in a source follower topology to receive the primary supply voltage at a drain terminal, receive the control voltage at a gate terminal and output a first output voltage from a source terminal.

20. The apparatus of claim 17, wherein the voltage control unit is configured to increase or decrease the voltage level of the control signal in response to a digital signal fed back from the delay circuit.

* * * * *